(12) United States Patent
Kishimoto et al.

(10) Patent No.: US 9,644,270 B2
(45) Date of Patent: May 9, 2017

(54) OXIDE SEMICONDUCTOR DEPOSITING APPARATUS AND METHOD OF MANUFACTURING OXIDE SEMICONDUCTOR USING THE SAME

(71) Applicant: Samsung Display Co., Ltd., Yongin, Gyeonggi-Do (KR)

(72) Inventors: Katsushi Kishimoto, Hwaseong-si (KR); Yeon-Keon Moon, Seoul (KR); Sang-Woo Sohn, Yongin-si (KR); Takayuki Fukasawa, Seoul (KR); Sang-Won Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 7 days.

(21) Appl. No.: 14/513,463

(22) Filed: Oct. 14, 2014

(65) Prior Publication Data
US 2015/0270118 A1    Sep. 24, 2015

(30) Foreign Application Priority Data
Mar. 21, 2014   (KR) .................. 10-2014-0033267

(51) Int. Cl.
| | |
|---|---|
| C23C 16/50 | (2006.01) |
| H01L 29/786 | (2006.01) |
| H01L 29/66 | (2006.01) |
| H01L 21/67 | (2006.01) |
| C23C 16/40 | (2006.01) |

(Continued)

(52) U.S. Cl.
CPC ............. *C23C 16/50* (2013.01); *C23C 16/40* (2013.01); *C23C 16/46* (2013.01); *C23C 16/509* (2013.01); *H01L 21/3105* (2013.01); *H01L 21/67109* (2013.01); *H01L 21/67207* (2013.01); *H01L 21/67745* (2013.01); *H01L 29/66969* (2013.01); *H01L 29/7869* (2013.01); *H01L 29/78693* (2013.01); *H01L 21/02554* (2013.01); *H01L 21/02565* (2013.01)

(58) Field of Classification Search
None
See application file for complete search history.

(56) References Cited

U.S. PATENT DOCUMENTS

| | | | |
|---|---|---|---|
| 5,449,410 A | 9/1995 | Chang et al. | |
| 2002/0137310 A1* | 9/2002 | Joo | C30B 1/023 |
| | | | 438/487 |

(Continued)

FOREIGN PATENT DOCUMENTS

| | | |
|---|---|---|
| JP | 2004241420 A | 8/2004 |
| KR | 100255088 B1 | 2/2000 |

(Continued)

*Primary Examiner* — Shaun Campbell
*Assistant Examiner* — Aneta Cieslewicz
(74) *Attorney, Agent, or Firm* — Cantor Colburn LLP

(57) ABSTRACT

An oxide semiconductor depositing apparatus includes a heating chamber which is configured to heat and plasma-treat a first substrate including an insulation layer, and includes a chamber body, a heater disposed in the chamber body which is configured to heat the first substrate, and a cathode plate spaced apart from the heater, a high frequency voltage applied to the cathode plate, and a first process chamber which is configured to provide an oxide semiconductor layer on the insulation layer of the first substrate.

8 Claims, 11 Drawing Sheets

(51) Int. Cl.
*C23C 16/509* (2006.01)
*H01L 21/677* (2006.01)
*H01L 21/3105* (2006.01)
*C23C 16/46* (2006.01)
*H01L 21/02* (2006.01)

(56) References Cited

U.S. PATENT DOCUMENTS

| | | | |
|---|---|---|---|
| 2005/0092732 A1* | 5/2005 | Kim | F27D 1/045 |
| | | | 219/444.1 |
| 2006/0172065 A1* | 8/2006 | Carlotto | B01J 2/006 |
| | | | 427/212 |
| 2006/0199398 A1* | 9/2006 | Sugawara | H01L 21/28176 |
| | | | 438/795 |
| 2008/0023139 A1 | 1/2008 | Yasui et al. | |
| 2009/0022908 A1* | 1/2009 | Yang | C23C 16/24 |
| | | | 427/579 |
| 2011/0147734 A1* | 6/2011 | Kim | H01L 29/7869 |
| | | | 257/43 |
| 2012/0061663 A1* | 3/2012 | Yamazaki | H01L 21/02488 |
| | | | 257/43 |
| 2012/0255859 A1 | 10/2012 | Tsukamoto | |
| 2014/0273539 A1* | 9/2014 | Pan | H01L 21/0234 |
| | | | 438/800 |
| 2015/0123120 A1* | 5/2015 | Yamazaki | H01L 29/7869 |
| | | | 257/43 |

FOREIGN PATENT DOCUMENTS

| | | | |
|---|---|---|---|
| KR | 1020010002399 A1 | 1/2001 | |
| KR | 1020080047897 A | 5/2008 | |

* cited by examiner

OXIDE SEMICONDUCTOR DEPOSITING APPARATUS AND METHOD OF MANUFACTURING OXIDE SEMICONDUCTOR USING THE SAME

This application claims priority to Korean Patent Application No. 10-2014-0033267, filed on Mar. 21, 2014, and all the benefits accruing therefrom under 35 U.S.C. §119, the disclosure of which is incorporated by reference herein in its entirety.

BACKGROUND

1. Field

Exemplary embodiments of the invention relate to an oxide semiconductor depositing apparatus and a method of manufacturing an oxide semiconductor using the oxide semiconductor depositing apparatus.

More particularly, exemplary embodiments of the invention relate to an oxide semiconductor depositing apparatus for forming an oxide semiconductor on a substrate for a display apparatus and a method of manufacturing an oxide semiconductor using the oxide semiconductor depositing apparatus.

2. Description of the Related Art

Recently, a display apparatus having light weight and small size has been manufactured. A cathode ray tube ("CRT") display apparatus has been used due to a performance and a competitive price. However, the CRT display apparatus has a weakness with a size or portability. Therefore, a display apparatus such as a plasma display apparatus, a liquid crystal display ("LCD") apparatus and an organic light emitting display ("OLED") apparatus has been highly regarded due to small size, light weight and low-power-consumption.

The LCD apparatus includes a display panel including a switching element. The switching element may be formed by using an oxide semiconductor.

SUMMARY

An oxide semiconductor has a substantially low semiconductor characteristic.

One or more exemplary embodiments of the invention provides an oxide semiconductor depositing apparatus for forming an oxide semiconductor of a display apparatus which has an improved semiconductor characteristic.

One or more exemplary embodiments of the invention also provide a method of manufacturing an oxide semiconductor using the oxide semiconductor depositing apparatus.

According to an exemplary embodiment of the invention, an oxide semiconductor depositing apparatus includes a heating chamber which is configured to heat and plasma treat a first substrate including an insulation layer, and a first process chamber which is configured to provide an oxide semiconductor layer on the insulation layer of the first substrate. The heating chamber includes a chamber body, a heater disposed in the chamber body which is configured to heat the first substrate, and a cathode plate spaced apart from the heater, and to which a high frequency voltage is applied.

In an exemplary embodiment, the oxide semiconductor depositing apparatus further includes a gas inlet through which a gas is provided into the chamber body. The cathode plate may include an upper plate and a lower plate which faces the upper plate. The upper plate may be connected to the gas inlet. A plurality of spraying holes may be defined through the lower plate.

In an exemplary embodiment, the upper plate of the cathode plate of the heating chamber may further include a diffusion portion spaced apart from the lower plate, a side wall which surrounds the diffusion portion and contacts the lower plate, and a main path defined in the diffusion portion and connected to the gas inlet.

In an exemplary embodiment, the upper plate of the cathode plate of the heating chamber may further include a first branch path defined in the diffusion portion and connected to the main path, and a second branch path connected to the first branch path.

In an exemplary embodiment, the gas inlet may be connected to the main path through the side wall of the upper plate of the cathode plate.

In an exemplary embodiment, the upper plate and the lower plate of the cathode plate of may include one or more of aluminum, titanium and an alloy thereof.

In an exemplary embodiment, the heating chamber may be smaller than the cathode plate in a plan view, and the heating chamber may be larger than the first substrate in the plan view.

In an exemplary embodiment, a size of the cathode plate may be more than about 100 percent (%) size of that of the heater and less than about 110% size of that of the heater.

In an exemplary embodiment, the oxide semiconductor depositing apparatus may further include a gas spraying part configured to provide a gas in to the chamber body of the heating chamber, and a cooler which is configured to cool the first substrate.

In an exemplary embodiment, the heater may include a central portion and a peripheral portion which surrounds the central portion. The central portion and the peripheral portion may be individually controllable.

According to an exemplary embodiment of the invention, a method of manufacturing an oxide semiconductor includes forming an insulation layer on a substrate, plasma treating a surface of the insulation layer, and forming an active pattern including an oxide semiconductor on the insulation layer which is plasma treated. The plasma treating includes heating the insulation layer, and the generating a plasma on the insulation layer after heating the insulation layer.

In an exemplary embodiment, the plasma treating may further include re-heating the insulation layer after the generating the plasma.

In an exemplary embodiment, the heating the insulation layer of the plasma treating may include first heating an entire portion of the substrate, and second heating a central portion of the substrate except for a boundary of the substrate.

In an exemplary embodiment, gas for the plasma treating may be provided on the substrate in the second heating operation and in the generating the plasma.

In an exemplary embodiment, the plasma treating may further include cooling the substrate after the re-heating the substrate.

In an exemplary embodiment, the forming the active pattern may include forming a bottom layer on the insulation layer, forming a bulk layer on the bottom layer, and forming a surface layer on the bulk layer.

In an exemplary embodiment, in the plasma treating, the substrate may be plasma treated using an oxide semiconductor deposition apparatus including a chamber body, a heater disposed in the chamber body and configured to heat the substrate, and a cathode plate to which a high frequency voltage is applied, In an exemplary embodiment, the cathode plate of the oxide semiconductor depositing apparatus may include one or more of aluminum, titanium and alloy thereof.

According to the invention, an oxide semiconductor deposition apparatus includes a first loading-unloading chamber which includes a heater and a cathode plate, so that an insulation of a substrate may be plasma treated to improve a semiconductor characteristic of the oxide semiconductor formed on the insulation layer.

According to the invention, an oxide semiconductor layer is plasma treated before the oxide semiconductor layer formed on the first substrate in a method of manufacturing an oxide semiconductor, so that a semiconductor characteristic of the oxide semiconductor may be improved and out gas of the insulation layer may be controllable.

In addition, the cathode plate may include aluminum, titanium and alloy including thereof. Thus, impurities, which may disturb a formation of an oxide semiconductor layer, formed during plasma treating to the substrate may be reduced.

In addition, the cathode plate may have a plate shape, so that space of a first loading-unloading chamber may be efficiently used.

In addition, the heater includes a central portion and a peripheral portion which is individually controllable, so that plasma treating quality may be improved.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
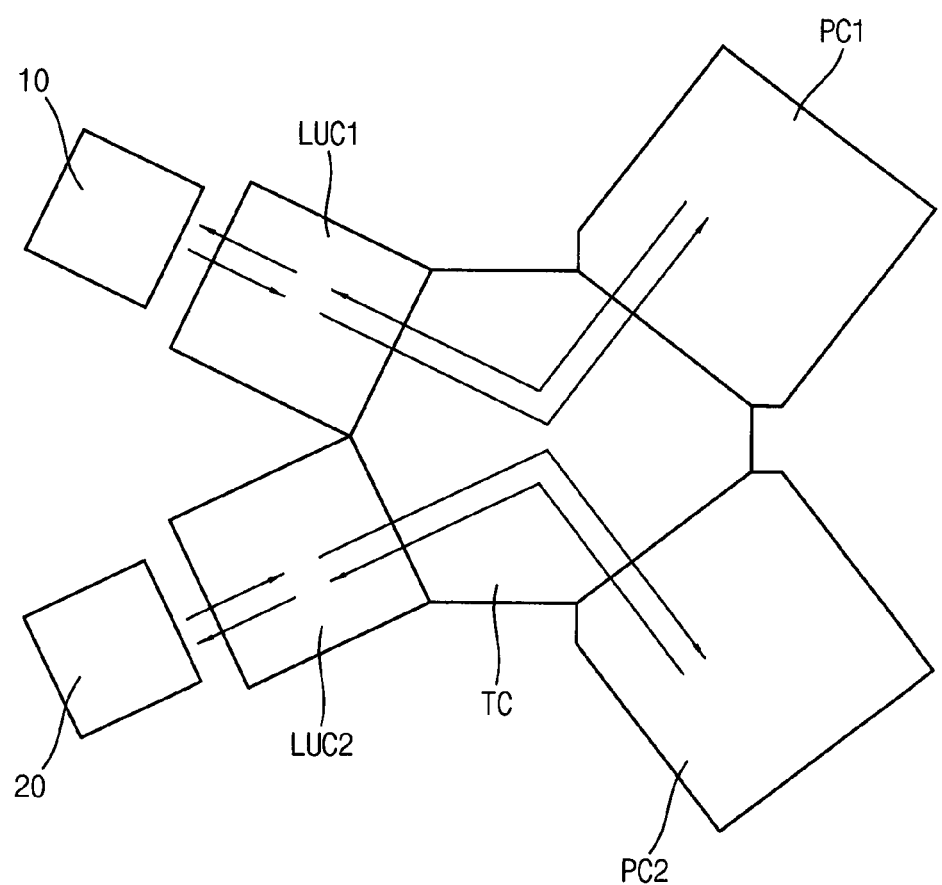
FIG. 1 is a plain view briefly illustrating an exemplary embodiment of an oxide semiconductor depositing apparatus according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, connected may refer to features being electrically, physically and/or fluidly connected to each other.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

FIG. 1 is a plain view briefly illustrating an oxide semiconductor depositing apparatus according to an exemplary embodiment of the invention.

Referring to FIG. 1, an oxide semiconductor depositing apparatus includes a first loading-unloading chamber LUC1, a second loading-unloading chamber LUC2, a transferring chamber TC, a first process chamber PC1 and a second process chamber PC2.

The first loading-unloading chamber LUC1 is connected to the transferring chamber TC. A first substrate 10 may be loaded in the first loading-unloading chamber LUC1. The first substrate 10 may be transferred to the first process chamber PC1 through the first loading-unloading chamber LUC1 and the transferring chamber TC, and then an oxide semiconductor may be disposed on the first substrate 10. And then, the first substrate 10 on which the oxide semiconductor is disposed may be transferred to the first loading-unloading chamber LUC1 through the transferring chamber TC, and then the first substrate 10 may be unloaded from the first loading-unloading chamber LUC1 (refer to an arrow in the figure).

The first loading-unloading chamber LUC1 will be described in detail in FIGS. 2 to 5.

The transferring chamber TC is connected to the first loading-unloading chamber LUC1. In an exemplary embodiment, the transferring chamber TC may include a robot arm (not shown) to move the first substrate 10 and the second substrate 20. The robot arm of the transferring chamber TC may transfer substrates in the oxide semiconductor depositing apparatus. In an exemplary embodiment, the robot arm may alternately transfer the first and second substrates (refer to an arrow in the figure).

The first process chamber PC1 is connected to the transferring chamber TC. An oxide semiconductor layer may be disposed in the first process chamber PC1. In an exemplary embodiment, the first process chamber PC1 may be a plasma enhanced chemical vapor deposition ("PECVD") chamber, and the oxide semiconductor layer may be disposed on the first substrate 10 by a sputtering method, for example.

The oxide semiconductor layer may include a metal oxide semiconductor. In an exemplary embodiment, the metal oxide semiconductor may include an oxide of zinc, indium, gallium, tin, titanium, phosphor or combination thereof. In an exemplary embodiment, the metal oxide semiconductor may include at least one of zinc oxide (ZnO), zinc tin oxide ("ZTO"), zinc indium oxide ("ZIO"), indium oxide (InO), titanium oxide (TiO), indium gallium zinc oxide ("IGZO") and indium zinc tin oxide ("IZTO"), for example.

Although the oxide semiconductor depositing apparatus includes the first process chamber PC1 in the exemplary embodiment, the invention is not limited thereto, and the oxide semiconductor depositing apparatus may include a plurality of process chambers. The oxide semiconductor layer including a plurality of layers may be provided in the process chambers. In an exemplary embodiment, the oxide semiconductor layer may include a bottom layer, a bulk layer and a surface layer disposed on the first substrate 10 in a sequential order, for example. The first substrate 10 may move among the process chambers through the transferring chamber TC.

The second loading-unloading chamber LUC2 is electrically connected to the transferring chamber TC. A second substrate 20 may be loaded in the second loading-unloading chamber LUC2. The second substrate 20 is may be transferred to the second process chamber PC2 through the second loading-unloading chamber LUC2 and the transferring chamber TC, and then an oxide semiconductor may be disposed on the second substrate 20. And then, the second substrate 20 on which the oxide semiconductor is provided may be transferred to the second loading-unloading chamber LUC2 through the transferring chamber TC, and then the second substrate 20 may be unloaded from the second loading-unloading chamber LUC2 (refer to an arrow in the figure).

Elements of the second loading-unloading chamber LUC2 may be substantially the same as those of the first loading-unloading chamber LUC1.

The second process chamber PC2 is connected to the transferring chamber TC. An oxide semiconductor layer may be disposed in the second process chamber PC2. In an exemplary embodiment, the second process chamber PC2 may be a PECVD chamber, and the oxide semiconductor layer may be disposed on the second substrate 20 by a sputtering method, for example.

Although the oxide semiconductor depositing apparatus includes the second process chamber PC2 in the illustrated exemplary embodiment, the invention is not limited thereto, and the oxide semiconductor depositing apparatus may include a plurality of process chambers. The oxide semiconductor layer including a plurality of layers may be provided in the process chambers. In an exemplary embodiment, the oxide semiconductor layer may include a bottom layer, a bulk layer and a surface layer disposed on the second substrate 20 in a sequential order. The second substrate 20 may move among the process chambers through the transferring chamber TC.

The first substrate 10 and the second substrate 20 may be simultaneously or alternately loaded-unloaded and/or transferred between process chambers. In addition, although the oxide semiconductor depositing apparatus includes two process chambers and two loading-unloading chambers in the illustrated exemplary embodiment, the invention is not limited thereto, and the oxide semiconductor depositing apparatus may include any number of loading-unloading chambers and process chambers to form an oxide semiconductor.

Figure 2:
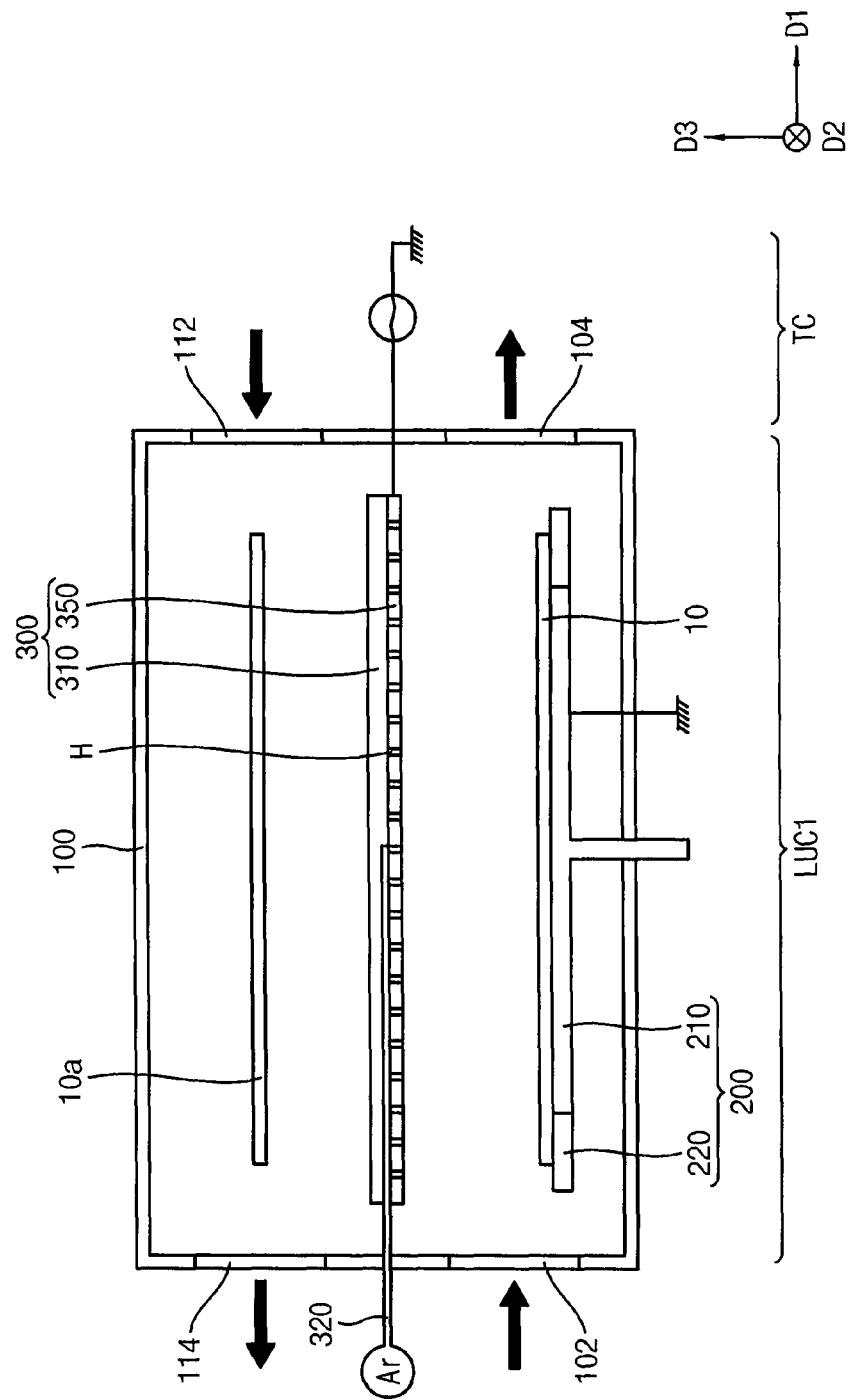
FIG. 2 is a side cross-sectional view minutely illustrating a first loading-unloading chamber of the oxide semiconductor depositing apparatus of FIG. 1.
Figure 3:
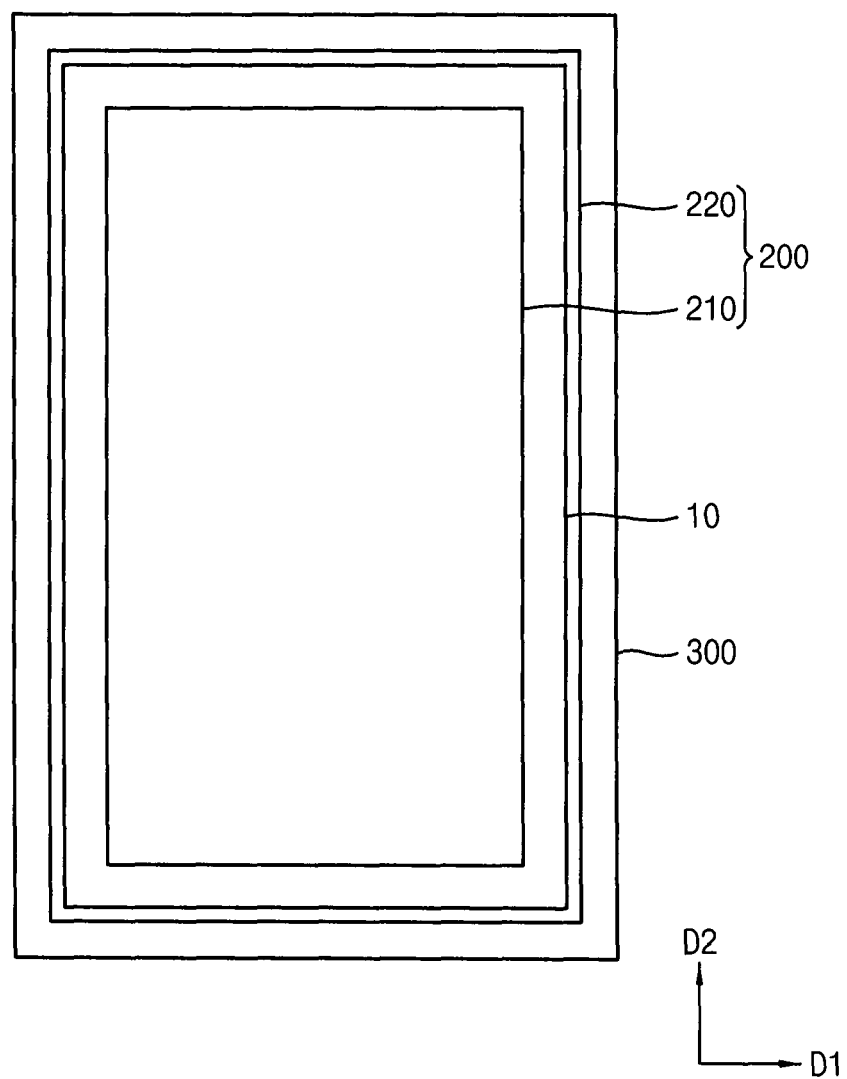
FIG. 3 is a plain view to explain sizes of a heater, a substrate and a cathode plate of the first loading-unloading chamber of FIG. 2.
Figure 4:
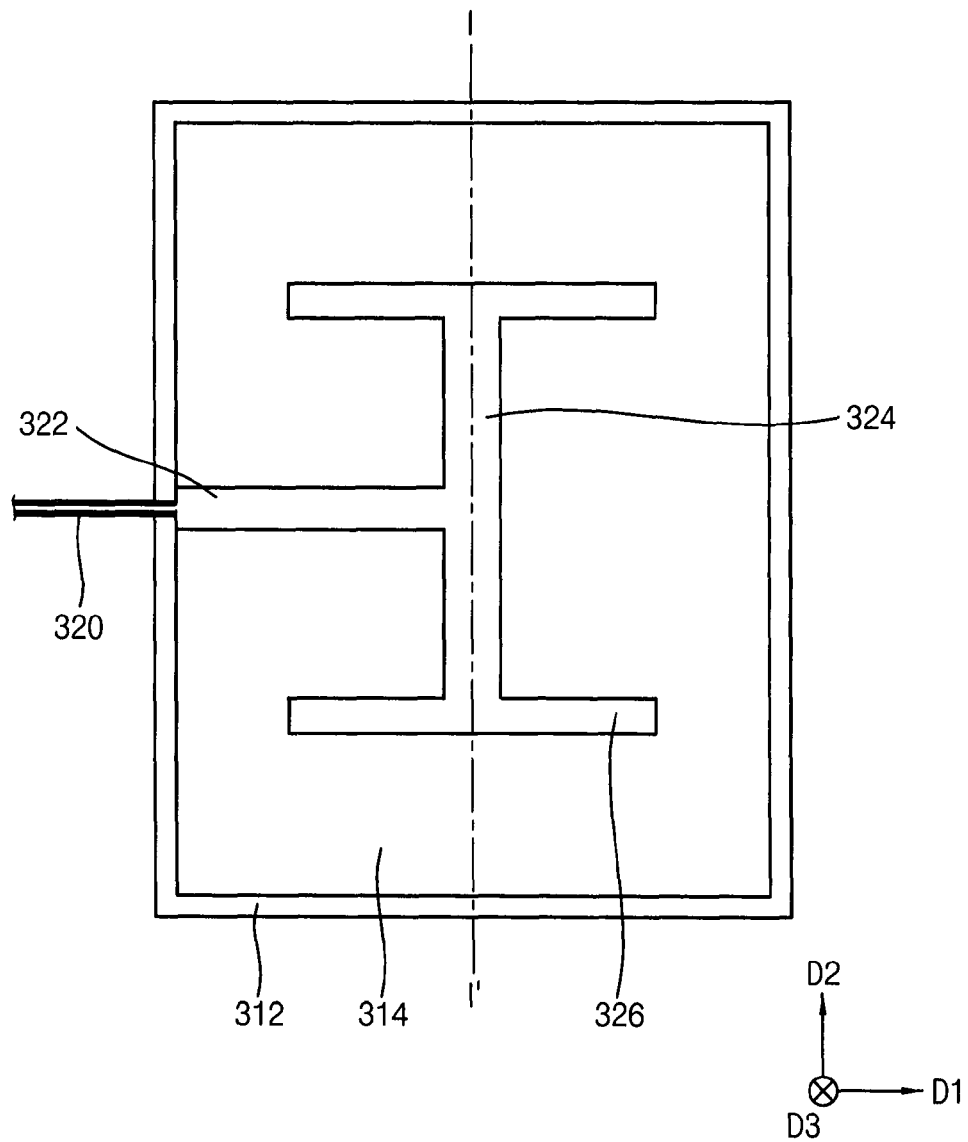
FIG. 4 is a bottom view illustrating a cathode plate of FIG. 2.
Figure 5:
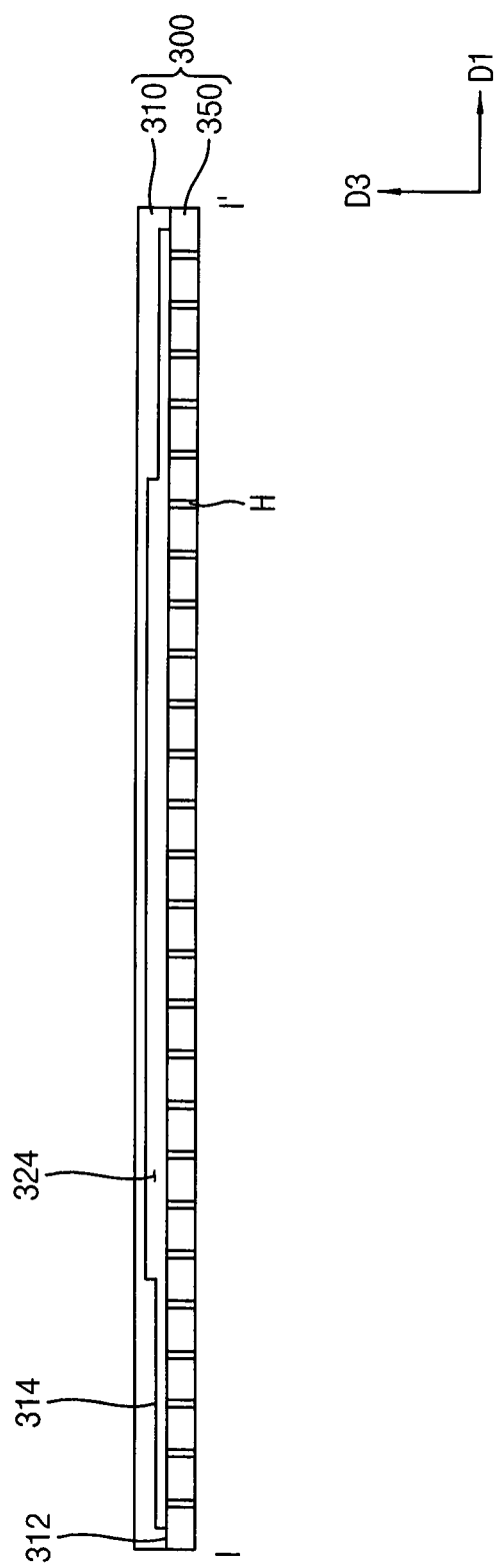
FIG. 5 is a side cross-sectional view taken along line I-I' of FIG. 4 illustrating a cathode plate of FIG. 2.

FIG. 2 is a side cross-sectional view minutely illustrating a first loading-unloading chamber of the oxide semiconductor depositing apparatus of FIG. 1. FIG. 3 is a plain view to explain sizes of a heater, a substrate and a cathode plate of the first loading-unloading chamber of FIG. 2. FIG. 4 is a bottom view illustrating a cathode plate of FIG. 2. FIG. 5 is a side cross-sectional view taken along line I-I' of FIG. 4 illustrating a cathode plate of FIG. 2.

Referring to FIGS. 2 to 5, a first loading-unloading chamber LUC1 includes a chamber body 100, a heater 200, a cathode plate 300 and a gas inlet 320.

The chamber body 100 includes a first entrance 102, a first exit 104, a second entrance 112 and a second exit 114. Each of the first entrance 102, the first exit 104, the second entrance 112 and the second exit 114 may be opened or closed, and the chamber body 100 may isolate inside of the chamber body 100 from outside of the chamber body 100.

The first substrate 10 may be transferred into the chamber body 100 through the first entrance 102 to be loaded in the oxide semiconductor depositing apparatus. The first substrate 10 may be transferred to a transferring chamber TC (refer to FIG. 1) through the first exit 104 in a first direction D1. The first substrate 10a which has passed the first process chamber PC (refer to FIG. 1) may be inserted into the chamber body 100 from the transferring chamber through the second entrance 112, and may be moved out from the chamber body 100 through the second exit 114 in the first direction D1, so that the first substrate 10a may be unloaded out from the oxide semiconductor depositing apparatus.

The first substrate 10 may pass through a lower portion of the chamber body 100 with reference to the cathode plate 300 before the plasma treating operation, and first substrate 10a, on which an oxide semiconductor is disposed after the plasma treating operation may pass through an upper portion of the chamber body 100 with reference to the cathode plate 300.

In an exemplary embodiment, the cathode plate 300 has a plate shape, for example, so that space of a first loading-unloading chamber LUT1 may be efficiently used.

The heater 200 is disposed in the chamber body 100. The heater 200 may heat the first substrate 10 which is placed on the heater 200. The heater 200 includes a central portion 210 and a peripheral portion 220. The central portion 210 is disposed in a center of the heater 200 in a plan view. The peripheral portion 220 surrounds the central portion 210 in a plan view, and disposed at a boundary of the heater 200. The heater 200 may make contact to the first substrate 10 and be earthed.

The central portion 210 and the peripheral portion 220 may be individually driven. In an exemplary embodiment, the central portion 210 and the peripheral portion 220 may be turned on at the same time, so that entire portion of the first substrate 10 may be heated, for example. In addition, only the peripheral portion 220 is turned on, so that only a boundary of the first substrate 10 may be heated. In addition, the central portion 210 and the peripheral portion 220 may heat the substrate 10 with different intensities.

The cathode plate 300 is disposed in the chamber body 100. The cathode plate 300 faces the heater 200, and may be spaced apart from the heater 200. The cathode plate 300 includes an upper plate 310 and a lower plate 350.

The upper plate 310 includes a side wall 312, a diffusion portion 314, a main path 322 and a first branch path 324 and a second branch path 326. The side wall 312 is provided at a boundary of the upper plate 310. The side wall 312 is protruded from the diffusion portion 314 to the lower plate 350, so that a space is defined between the diffusion portion 314 and the lower plate 350. The main path 322 extends from the side wall 312 to a central portion of the bottom plate 350. The first branch path 324 is connected to the main path 322, and extends in a direction which is different form an extension direction of the main path 322. The second branch path 326 is connected to the first branch path 324, and extends in a direction which is different form an extension direction of the first branch path 324.

The main path 322, the first branch path 324 and the second branch path 326 may be a groove defined in the diffusion portion 314. Thus, gas which is provided form the main path 322 may be spread over the diffusion portion 314 through the first branch path 324 and the second branch path 326.

In an exemplary embodiment, the upper plate 310 may include at least one of aluminum Al, titanium Ti and alloy including thereof, for example.

The lower plate 350 faces the upper plate 310. A boundary of the lower plate 350 may make contact with the side wall 312 of the upper plate 310. In an exemplary embodiment, a high frequency voltage may be applied to the lower plate 350. A plurality of spraying holes H is defined through the lower plate 350. The spraying holes H may be uniformly arranged in the lower plate 350 in a plan view. Gas for plasma treating may be sprayed through the spraying holes H. The gas which is spread over the diffusion portion 314 of the diffusion portion 314 may be spayed form the spraying holes H. In an exemplary embodiment, the lower plate 350 may be a shower head to spray the gas, for example. The high frequency voltage may be applied to the shower head.

In an exemplary embodiment, the lower plate 350 may include at least one of aluminum Al, titanium Ti and alloy including thereof, for example. In an exemplary embodiment, the lower plate 350 may include a material which is substantially same as a material of the upper plate 310.

In an exemplary embodiment, the cathode plate 300 may include at least one of aluminum (Al), titanium (Ti) and alloy including thereof. Thus, impurities, which may disturb a formation of an oxide semiconductor layer, provided during plasma treating to the first substrate 10 may be reduced.

Referring again to FIG. 3, the heater 200 is larger than the first substrate 10, and smaller than the cathode plate 300 in a plan view. In an exemplary embodiment, in a plan view, the heater 200 may have a size which is more than about 100 percent (%) size of the first substrate 10 and less than about 110% size of the first substrate 10, for example. In addition, in a plan view, the cathode plate 300 may have a size which is more than about 100% size of the heater 200 and less than about 110% size of the heater 200, for example.

The gas inlet 320 is connected to the main path 322 of the upper plate 310 of the cathode plate 300. Gas for plasma treating may be provided to the main path 322 through the gas inlet 320. In an exemplary embodiment, argon (Ar) gas may be provided to the main path 322 through the gas inlet 320, for example. The argon gas may be sprayed from the spraying holes H, which is defined through the lower plate 350, to a space between the first substrate 10 and the cathode plate 300 by passing the main path 322, the first branch path 324 and the second branch path 326.

Argon gas may be provided into the first loading-unloading chamber LUC1 through the gas inlet 320, so that required pressure may be provided in the first loading-unloading chamber LUC1. The heater 200 may heat the first substrate 10 placed on the heater 200, so that required temperature may be provided. Proper pressure and temperature are provided in the first loading-unloading chamber LUC1, and then a high frequency voltage is applied to the cathode plate 300, and then surface of the first substrate 10 may be plasma treated. In an exemplary embodiment, a surface of a gate insulation layer on the first substrate 10 may be plasma treated. And then, an oxide semiconductor layer may be disposed on the gate insulation layer in a process chamber PC1. (refer to FIG. 1)

According to the exemplary embodiment, the surface of the insulation layer is plasma treated before the oxide semiconductor layer is disposed on the first substrate, so that semiconductor characteristic of the oxide semiconductor layer may be improved, and out gas of the insulation layer may be controllable.

The first substrate 10 may pass through a lower portion of the chamber body 100 with reference to the cathode plate 300 before the plasma treating operation, and first substrate 10a on which an oxide semiconductor is disposed after the plasma treating operation may pass through an upper portion of the chamber body 100 with reference to the cathode plate 300. Thus, the cathode plate 300 divides inside of the chamber body 100 into two portions, and the gas inlet 320 may be connected to the cathode plate 300 through the side wall of the cathode plate 300.

Figure 6:
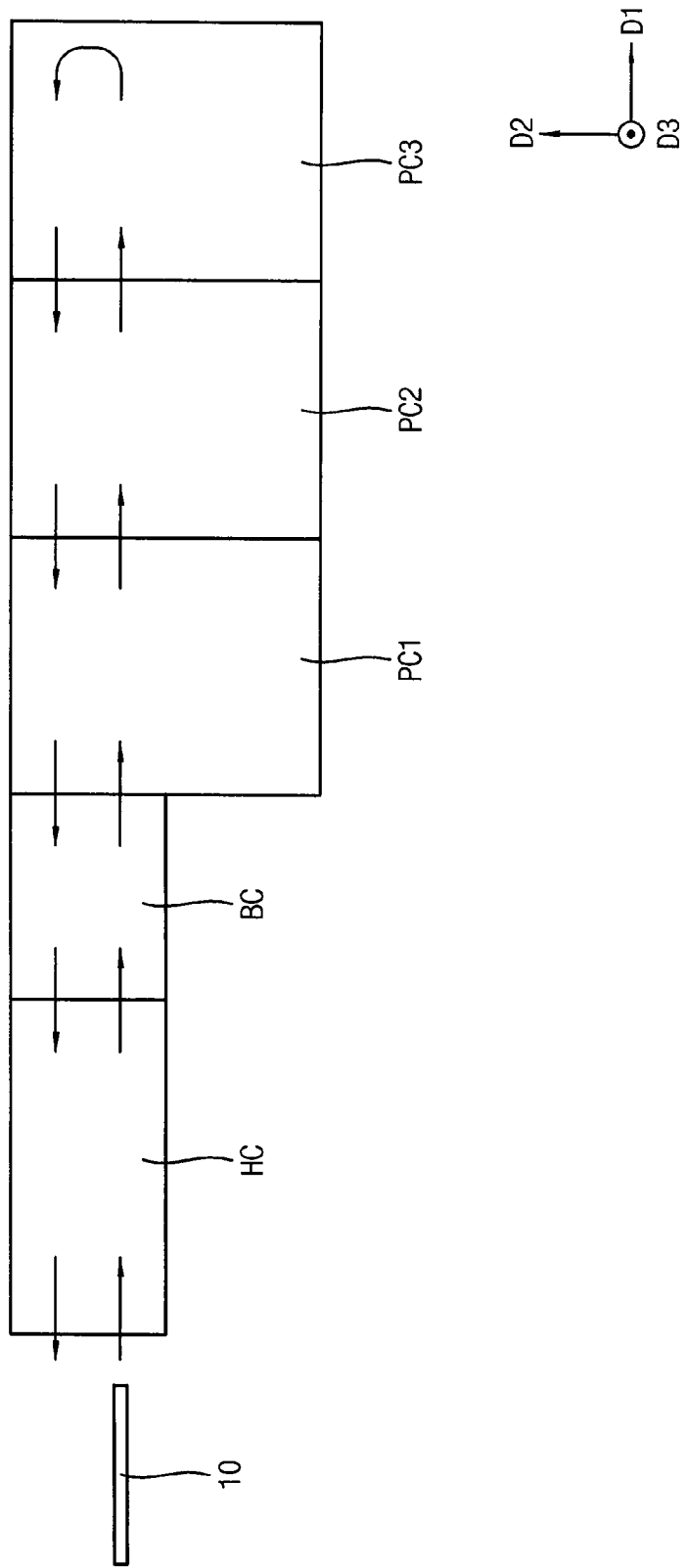
FIG. 6 is a cross-sectional view briefly illustrating an exemplary embodiment of an oxide semiconductor depositing apparatus according to the invention.

FIG. 6 is a cross-sectional view briefly illustrating an oxide semiconductor depositing apparatus according to an exemplary embodiment of the invention.

Referring to FIG. 6, an oxide semiconductor depositing apparatus includes a heating chamber HC, a buffer chamber BC, a first process chamber PC1, a second process chamber PC2 and a third process chamber PC3.

The heating chamber HC is connected to the buffer chamber BC. A substrate 10 may enter into the oxide semiconductor depositing apparatus through the heating chamber HC. The substrate 10 may be heated in the heating chamber HC.

The buffer chamber BC is connected to the heating chamber HC and the first process chamber PC1. The substrate 10 is transferred to the buffer chamber BC through the heating chamber HC. The substrate 10 may be plasma treated and cooled by the buffer chamber BC.

The heating chamber HC and the buffer chamber BC will be described in detail in FIGS. 7 to 9.

The first process chamber PC1 is connected to the buffer chamber BC. The second process chamber PC2 is connected to the first process chamber PC1. The third process chamber PC3 is connected to the second process chamber PC2.

The first substrate 10 moves through the first process chamber PC1, the second process chamber PC2 and the third process chamber PC3. An oxide semiconductor layer may be disposed on the first substrate 10.

In an exemplary embodiment, the substrate 10 may include an insulation layer, for example. The oxide semiconductor layer may include a bottom layer, a bulk layer and a surface layer. The bottom layer may be disposed on the insulation layer. The bottom layer may function as a seed layer of oxide semiconductor layer. The bulk layer is disposed on the bottom layer. The bulk layer may have relatively high electron mobility. The surface layer may be disposed on the bulk layer. The surface layer may have relatively high stability to protect the bulk layer.

In an exemplary embodiment, the first process chamber PC1 may be a PECVD chamber, and the bottom layer may be disposed on the first substrate 10 by a sputtering method, for example. In an exemplary embodiment, the second process chamber PC2 may be a PECVD chamber, and a bulk layer may be disposed on the bottom layer by a sputtering method, for example. In an exemplary embodiment, the third process chamber PC3 may be a PECVD chamber, and the surface layer may be provided by plasma treating a top surface of the bulk layer, for example.

The heating chamber HC, the buffer chamber BC, the first process chamber PC1, the second process chamber PC2 and the third process chamber PC3 are disposed adjacent each other and in a sequential order. The substrate 10 is entered into the oxide semiconductor depositing apparatus through the heating chamber HC, and while the substrate 10 passes the heating chamber HC, the buffer chamber BC, the first process chamber PC1, the second process chamber PC2 and the third process chamber PC3 in the sequential order, an oxide semiconductor layer may be disposed on the substrate 10. The substrate 10, on which the oxide semiconductor layer is disposed, passes the third process chamber PC3, the second process chamber PC2, the first process chamber PC1, the buffer chamber BC and the heating chamber HC in a sequential order, the substrate 10 may be unloaded out from the oxide semiconductor depositing apparatus.

Figure 7:
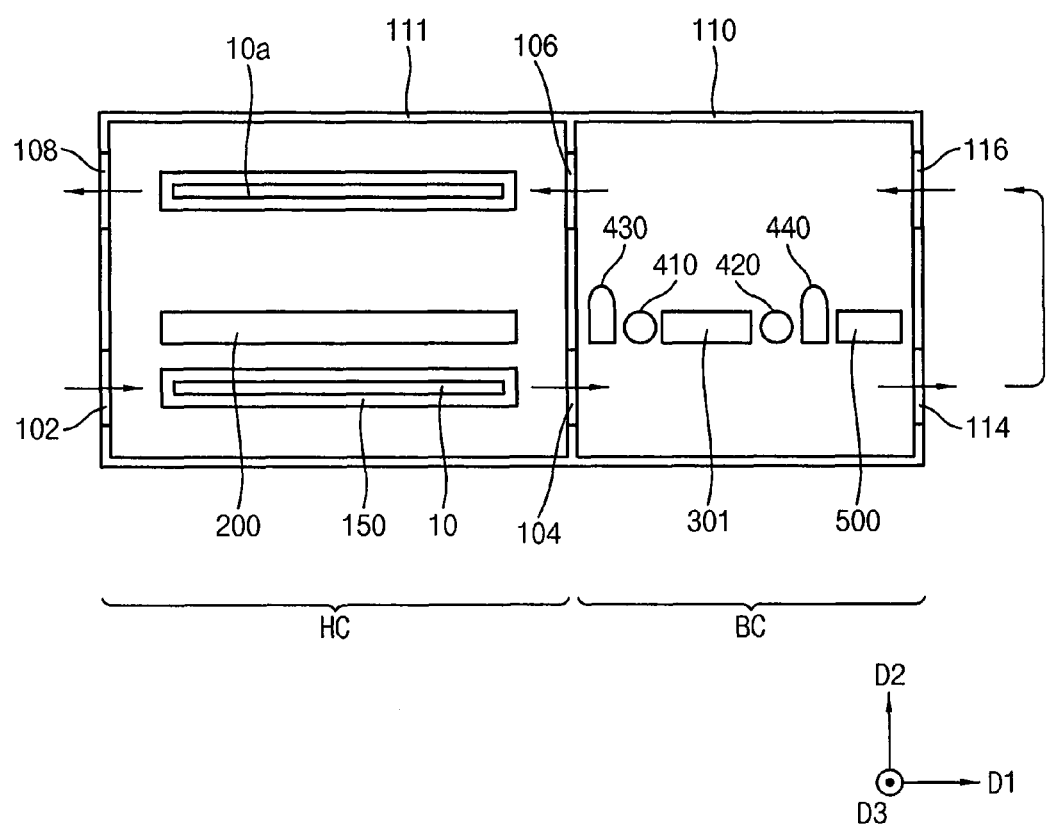
FIG. 7 is a planar cross-sectional view minutely illustrating a heating chamber and a buffer chamber of the oxide semiconductor depositing apparatus of FIG. 6.

FIG. 7 is a planar cross-sectional view minutely illustrating a heating chamber and a buffer chamber of the oxide semiconductor depositing apparatus of FIG. 6. FIG. 8 is a side cross-sectional view illustrating a heating chamber and a buffer chamber of the oxide semiconductor depositing apparatus of FIG. 6. FIG. 9 is a perspective view minutely illustrating a gas outlet of the buffer chamber of FIG. 8.

Figure 8:
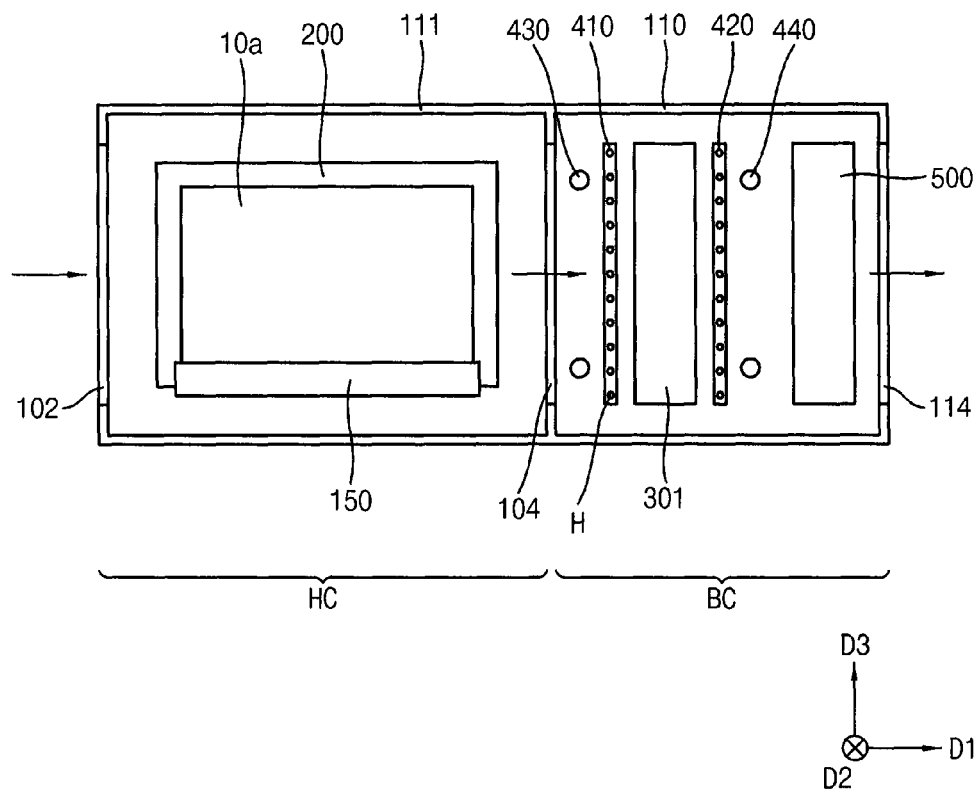
FIG. 8 is a side cross-sectional view illustrating a heating chamber and a buffer chamber of the oxide semiconductor depositing apparatus of FIG. 6.
Figure 9:
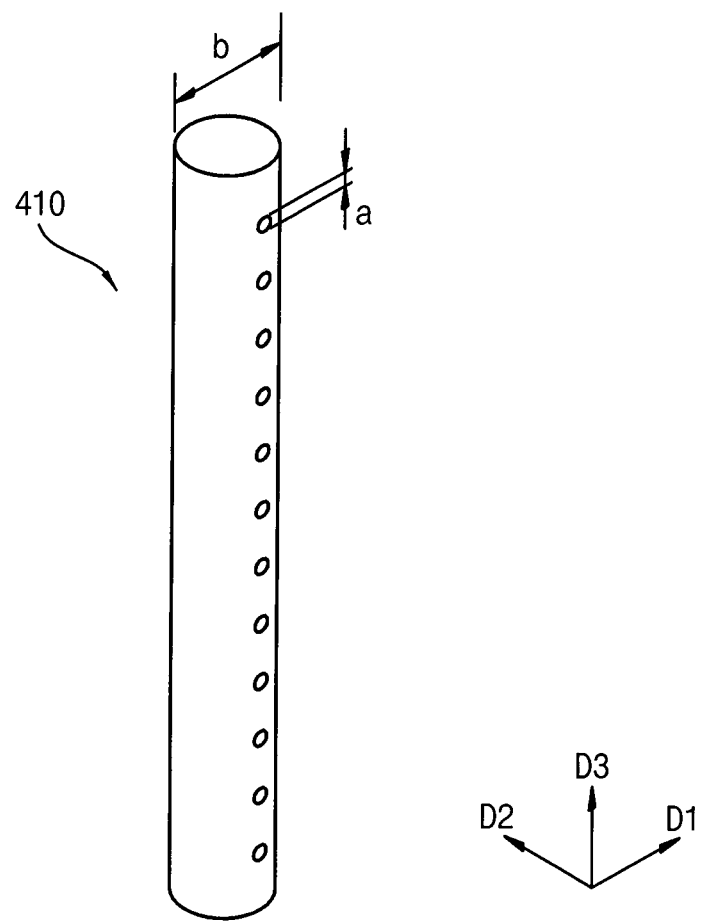
FIG. 9 is a perspective view minutely illustrating a gas outlet of the buffer chamber of FIG. 8.

Referring to FIGS. 7 to 9, the heating chamber HC includes a heating chamber body 111, and a heater 200. The buffer chamber BC includes a buffer chamber body 110, a plasma unit 301, a first gas spraying part 410, a second gas spraying part 420, a first exhaust pump 430, a second exhaust pump 440 and a cooler 500.

A substrate 10 may be moved through the heating chamber HC and the buffer chamber BC by a substrate holder 150 in parallel with a plane which is provided by the first direction D1 and a third direction D3. A second direction D2 is substantially perpendicular to the first direction D1. The third direction D3 is substantially perpendicular to the first and second directions D1 and D2.

The heating chamber body 111 of the heating chamber HC includes a first entrance 102, a first exit 104, a second entrance 106 and a second exit 108. Each of the first entrance 102, the first exit 104, the second entrance 106 and the second exit 108 may be opened or closed, and the heating chamber body 111 may isolate inside of the heating chamber body 111 from outside of the heating chamber body 111.

The heater 200 is disposed in the heating chamber body 111. The heater 200 extends in the first direction D1 and the third direction D3. The substrate 10 is entered into the heating chamber body 111 through the first entrance 102 of the heating chamber body 111, and then move to the buffer chamber BC through the first exit 104. The heater 200 may heat the substrate 10 while the substrate 10 passes on the heater 200.

The substrate 10a, which passed the buffer chamber BC, and the first to third process chambers PC1 to PC3 (refer to FIG. 6), may be entered into the heating chamber body 111 form the buffer chamber BC through the second entrance 106, and move out from the heating chamber body 111 through the second exit 108.

Thus, the first substrate 10 may pass through a portion of the heating chamber body 111 with reference to the heater 200 for heating, and the first substrate on which the oxide semiconductor layer is disposed may pass through other portion of the heating chamber body 111 with reference to the heater 200.

The buffer chamber body 110 includes a third exit 114 and a fourth entrance 116. The substrate 10 which has passed the heating chamber HC and the buffer chamber BC is transferred to the first to third process chambers PC1 to PC3 (refer to FIG. 6) through the third exit 114. The substrate 10a which has passed the first to third process chambers may be entered into the buffer chamber body 110 through the third entrance 116.

The plasma unit 301 is disposed in the buffer chamber BC. The plasma unit 301 may perform a plasma treating on a surface of the substrate 10 which passes on the plasma unit 301. The first gas spraying part 410 and the second gas spraying part 420 are disposed adjacent to the plasma unit 301. The first and second gas spraying parts 410 and 420 may spray gas for the plasma treating.

In an exemplary embodiment, the first gas spraying parts 410 may have a plurality of spraying holes having a first diameter a, for example. In an exemplary embodiment, the first gas spraying parts 410 may extend in the third direction D3 and have a cylindrical shape having a second diameter b, for example. The spraying holes are arranged in the third direction D3. In an exemplary embodiment, the first diameter a may be less than about one-tenth of the second diameter b, for example. Thus, although the first gas spraying parts 410 extends in the third direction D3, the first diameter a of the spraying hole is sufficiently small, so that gas may be uniformly spread on the substrate 10. In an exemplary embodiment, the gas may be an argon (Ar) gas, for example. The second gas spraying part 420 may be substantially the same as the first gas spraying part 410.

The plasma unit 301 is a cathode plate on which a high frequency voltage is applied, and the substrate holder may be earthed. Gas sprayed from the first and second gas spraying parts 410 and 420 may be eliminated by the first and second exhaust pumps 430 and 440 from the buffer chamber body 110. The first and second exhaust pumps 430 and 440 are disposed adjacent to the first and second gas spraying parts 410 and 420. The cooler 500 is disposed adjacent to the plasma unit 301 in the first direction D1. The substrate 10 may lower the temperature of the substrate 10 which gets higher due to plasma treating by the plasma unit 301.

Figure 10:
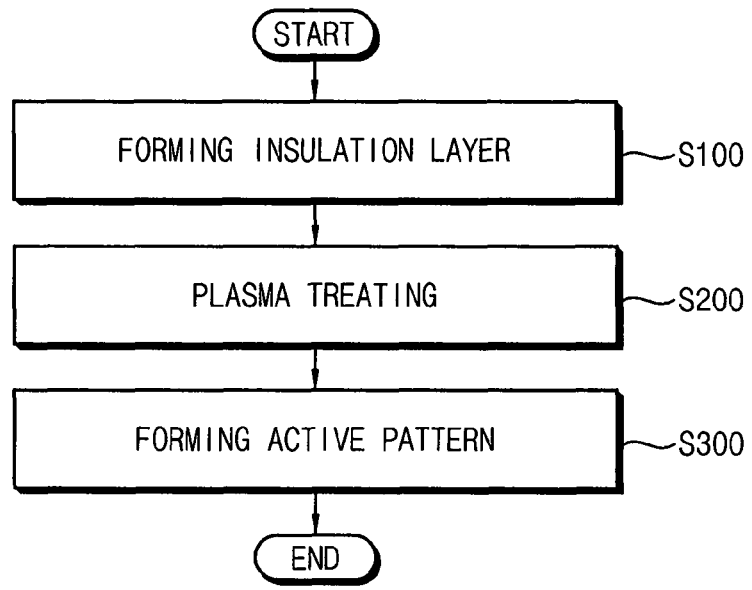
FIG. 10 is a flow chart illustrating an exemplary embodiment of a method of manufacturing an oxide semiconductor according to the invention.
Figure 11:
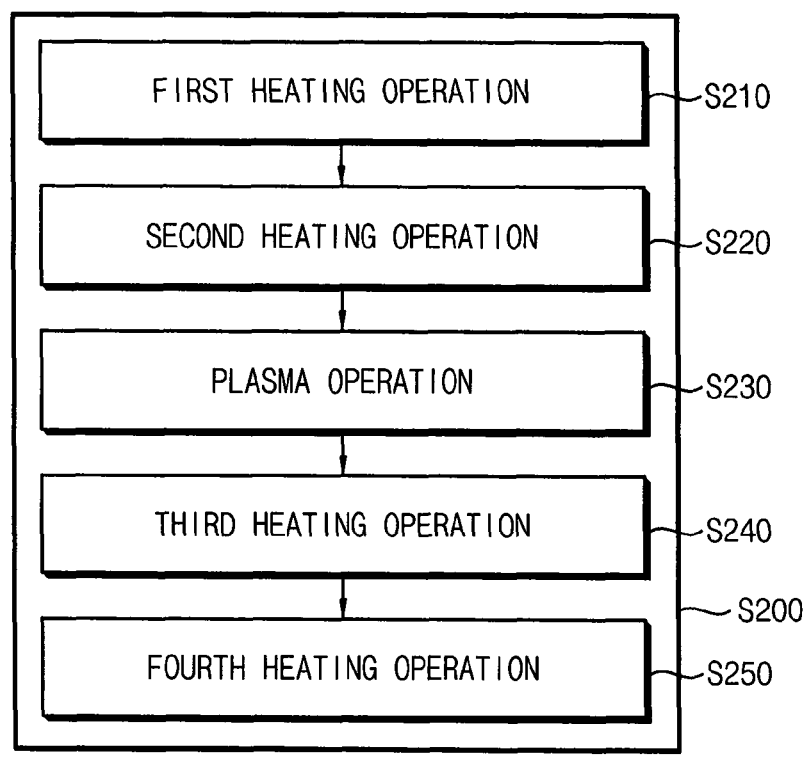
FIG. 11 is a flow chart minutely illustrating plasma treating operation of the method manufacturing the oxide semiconductor.
Figure 12:
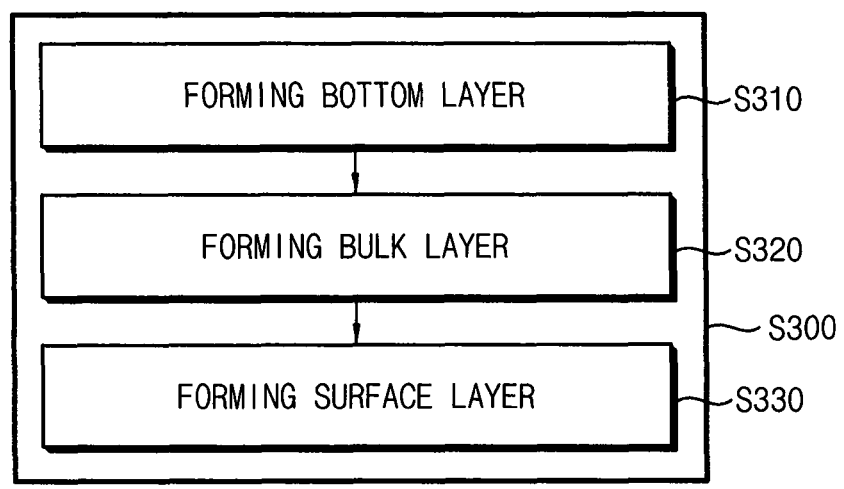
FIG. 12 is a flow chart minutely illustrating forming active pattern operation of the method manufacturing the oxide semiconductor.

FIG. 10 is a flow chart illustrating a method of manufacturing an oxide semiconductor according to an exemplary embodiment of the invention. FIG. 11 is a flow chart minutely illustrating plasma treating operation of the method manufacturing the oxide semiconductor. FIG. 12 is a flow chart minutely illustrating forming active pattern operation of the method manufacturing the oxide semiconductor.

Referring to FIGS. 10 to 12, a method of manufacturing an oxide semiconductor includes forming an insulation layer (S100), plasma treating (S200) and forming an active pattern S300.

An insulation layer may be disposed on a substrate in the forming an insulation layer. (S100) In an exemplary embodiment, the substrate may be a substrate for a display panel. A gate pattern including a gate line and a gate electrode may be disposed on the substrate. In an exemplary embodiment, the insulation layer may be disposed on the gate pattern. In an exemplary embodiment, the insulation layer may include inorganic insulating material such as silicon oxide (SiOx) and/or silicon nitride (SiNx). In an exemplary embodiment, the insulation layer may include low-k dielectric organic insulation film. In an exemplary embodiment, the insulation layer may include a double layer of inorganic insulation layer and organic insulation layer.

In exemplary embodiments, the insulation layer may be provided by a chemical vapor deposition, a spin coating, a PECVD, a sputtering, a vacuum deposition, a high density plasma chemical vapor deposition, a printing and etc.

A surface of the insulation layer is plasma treated in the plasma treating (S200). Hereinafter, the method will be explained with using an oxide semiconductor depositing apparatus of FIGS. 1 to 5.

A first substrate 10 is disposed between a heater 200 and a cathode plate 300, and then the first substrate 10 is heated and argon (Ar) gas is provide between the substrate 10 and the cathode plate 300, and then a high frequency voltage is applied to the cathode plate 300, the insulation layer of the first substrate 10 may be plasma treated.

The plasma treating (S200) includes first heating operation (S210), a second heating operation (S220), a plasma operation (S230), a third heating operation (S240) and a fourth heating operation (S250).

In the first heating operation (S210), the heater is turned on to heat entire portion of the substrate. In an exemplary embodiment, a central portion 210 of the heater 200 and a peripheral portion 220 of the heater 200 are turned on at the same time, so that entire portion of the substrate is heated.

In the second heating operation (S220), the heater is partially turned on to heat a portion of the substrate. In an exemplary embodiment, the peripheral portion 220 of the heater 200 is turned on and the central portion 210 of the heater 200 is turned off, so that the portion of the first substrate 10 may be heated.

In addition, in the second heating operation (S220), gas is provided on the substrate. In an exemplary embodiment, argon (Ar) gas is provided to a main path 322 of an upper plate 310 of the cathode plate 300 through a gas inlet 320, and then the argon gas passes the main path 322, a first branch path 324 and a second branch oath 326, and then the argon gas may be sprayed between the first substrate 10 and the cathode plate 300 through a plurality of holes H defined through a lower plate 350, for example.

In the plasma operation (S230), the substrate is plasma treated. In an exemplary embodiment, a high frequency voltage is applied to the cathode plate 300, and the heater 200 which contacts with the first substrate 10 is grounded, so that the first substrate 10 may be plasma treated by the argon gas between the first substrate 10 and the cathode plate 300.

At this time, the heater 200 may be turned off. In the plasma operation (S230), the heater 200 does not work, so that disturbance of plasma treating due to heat may be reduced.

In addition, in the plasma operation (S230), gas is provided on the substrate. In an exemplary embodiment, argon (Ar) gas is provided to the main path 322 of the upper plate 310 of the cathode plate 300 through the gas inlet 320, and then the argon gas passes the main path 322, a first branch path 324 and a second branch oath 326, and then the argon gas may be sprayed between the first substrate 10 and the cathode plate 300 through a plurality of holes H defined through a lower plate 350.

In the third heating operation (S240), the heater is partially turned on to heat a portion of the substrate. In an exemplary embodiment, the peripheral portion 220 of the heater 200 is turned on and the central portion 210 of the heater 200 is turned off, so that the portion of the first substrate 10 may be heated.

In the fourth heating operation (S250), heater is turned on to heat entire portion of the substrate. In an exemplary embodiment, a central portion 210 of the heater 200 and a peripheral portion 220 of the heater 200 are turned on at the same time, so that the entire portion of the substrate is heated.

Heated portions of the first substrate 10 in the first to fourth heating operations (S210, S220, S240 and S250), respectively, are different from each other, so that temperature imbalance between a central portion of the first substrate 10 and a boundary portion of the first substrate 10 due to the plasma treating may be reduced.

In the forming an active pattern (S300), an oxide semiconductor is disposed on the insulation layer of the substrate which is plasma treated.

The oxide semiconductor layer may be disposed in the first to third process chamber PC1, PC2 and PC3. The oxide semiconductor layer includes an oxide semiconductor. In an exemplary embodiment, the oxide semiconductor may include an amorphous oxide including at least one of indium (In), zinc (Zn), gallium (Ga), tin (Sn) and hafnium (Hf), for example. More particularly, the oxide semiconductor may include an amorphous oxide including indium (In), zinc (Zn) and gallium (Ga), or an amorphous oxide including indium (In), zinc (Zn) and hafnium (Hf), for example. In an exemplary embodiment, the oxide semiconductor may include an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO), for example.

The oxide semiconductor layer may be patterned into an active pattern which forms a thin film transistor.

The forming an active pattern S300 may include forming a bottom layer (S310), forming a bulk layer (S320) and forming a surface layer (S330).

A bottom layer is disposed on the insulation layer in the forming a bottom layer. In an exemplary embodiment, the bottom layer may be disposed on the insulation layer using a PECVD chamber by a puttering process, for example. The bottom layer may function as a seed layer of oxide semiconductor layer.

A bulk layer is disposed on the bottom layer in the forming a bulk layer (S320). In an exemplary embodiment, the bulk layer may be disposed on the bottom layer using a PECVD chamber by a puttering process, for example. The bulk layer may have relatively high electron mobility.

A surface layer may be disposed on the bulk layer in the forming a surface layer (S330). The surface layer may have relatively high stability to protect the bulk layer. In an exemplary embodiment, the surface layer may be provided by plasma treating a top surface of the bulk layer using a plasma treating chamber, for example.

Accordingly, the oxide semiconductor layer including the bottom layer, the bulk layer and the surface layer may be provided.

And then, an active pattern may be provided by patterning the oxide semiconductor layer.

According to the invention, an oxide semiconductor deposition apparatus includes a first loading-unloading chamber which includes a heater and a cathode plate, so that an insulation of a substrate may be plasma treated to improve a semiconductor characteristic of the oxide semiconductor disposed on the insulation layer.

According to the invention, an oxide semiconductor layer is plasma treated before the oxide semiconductor layer disposed on the first substrate in a method of manufacturing an oxide semiconductor, so that a semiconductor characteristic of the oxide semiconductor may be improved and out gas of the insulation layer may be controllable.

In addition, the cathode plate may include aluminum, titanium and alloy including thereof. Thus, impurities, which may disturb a formation of an oxide semiconductor layer, provided during plasma treating to the substrate may be reduced.

In addition, the cathode plate may have a plate shape, so that space of a first loading-unloading chamber may be efficiently used.

In addition, the heater includes a central portion and a peripheral portion which is individually controllable, so that plasma treating quality may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of manufacturing an oxide semiconductor comprising:
   forming an insulation layer on a substrate;
   plasma treating a surface of the insulation layer, the plasma treating comprises:
     heating the insulation layer using a heater in contact with the substrate; and
     generating a plasma on the insulation layer after heating the insulation layer; and
   forming an active pattern comprising an oxide semiconductor on the insulation layer which is plasma treated,
   wherein in the plasma treating, the substrate is plasma treated using an oxide semiconductor deposition apparatus including a chamber body and a gas outlet disposed in the chamber body and which outputs gas for the plasma treating, the substrate is plasma treated in a first portion of the chamber body relative to the gas outlet before forming the active pattern, and the substrate passes through a second portion of the chamber body different from the first portion relative to the gas outlet after the forming the active pattern.

2. The method of claim 1, wherein the plasma treating further comprises re-heating the insulation layer after the generating the plasma.

3. The method of claim 2, wherein the heating the insulation layer of the plasma treating comprises:
   first heating an entire portion of the substrate; and
   second heating a central portion of the substrate except for a boundary of the substrate.

4. The method of claim 3, wherein gas for the plasma treating is provided on the substrate in the second heating and in the generating the plasma.

5. The method of claim 2, wherein the plasma treating further comprises cooling the substrate after the re-heating the substrate.

6. The method of claim 1, wherein the forming the active pattern comprises:
   forming a bottom layer on the insulation layer;
   forming a bulk layer on the bottom layer; and
   forming a surface layer on the bulk layer.

7. The method of claim 1, wherein in the plasma treating, the oxide semiconductor deposition apparatus includes a
   heater disposed in the chamber body which selectively heats different portions of the substrate via conductive heating and a cathode plate to which a high frequency voltage is applied while the heater is grounded.

8. The method of claim 7, wherein the cathode plate of the oxide semiconductor depositing apparatus comprises one or more of aluminum, titanium and an alloy thereof.

* * * * *